United States Patent
Gao et al.

(10) Patent No.: US 11,776,811 B2
(45) Date of Patent: Oct. 3, 2023

(54) SELECTIVE DEPOSITION OF CARBON ON PHOTORESIST LAYER FOR LITHOGRAPHY APPLICATIONS

(71) Applicant: Applied Materials, Inc., Santa Clara, CA (US)

(72) Inventors: Larry Gao, Fremont, CA (US); Nancy Fung, Livermore, CA (US)

(73) Assignee: Applied Materials, Inc., Santa Clara, CA (US)

(*) Notice: Subject to any disclaimer, the term of this patent is extended or adjusted under 35 U.S.C. 154(b) by 248 days.

(21) Appl. No.: 17/202,043

(22) Filed: Mar. 15, 2021

(65) Prior Publication Data

US 2021/0358751 A1    Nov. 18, 2021

Related U.S. Application Data

(60) Provisional application No. 63/023,290, filed on May 12, 2020.

(51) Int. Cl.
    *H01L 21/033*      (2006.01)
    *H01L 21/311*      (2006.01)
    (Continued)

(52) U.S. Cl.
    CPC .... *H01L 21/0337* (2013.01); *H01L 21/31144* (2013.01); *G03F 7/0042* (2013.01); *G03F 7/2004* (2013.01)

(58) Field of Classification Search
    CPC ........... H01L 21/0337; H01L 21/31144; H01L 21/0273; H01L 21/3081; H01L 21/3086;
    (Continued)

(56) References Cited

U.S. PATENT DOCUMENTS 9,310,684 B2    4/2016   Meyers et al.
2004/0072430 A1*   4/2004   Huang .............. H01L 21/76808
                                                            257/E21.252

(Continued)

FOREIGN PATENT DOCUMENTS

KR    10-2008-0081584 A    9/2008
KR    10-2010-0106501 A    10/2010

OTHER PUBLICATIONS

2015 EUVL Symposium Oct. 6, 2015. See p. 3 and 4 which described the Tin oxide based metal PR. http://euvlsymposium.lbl.gov/pdf/2015/Oral_Tuesday/Session8_EUV%20Resist%203/S8.1_Kocsis.pdf <https://protect-us.mimecast.com/s/vEyhCrkqNvH1EgMC7_ZOq?domain=euvlsymposium.lbl.gov>.

(Continued)

*Primary Examiner* — Matthew L Reames
*Assistant Examiner* — Fakeha Sehar
(74) *Attorney, Agent, or Firm* — PATTERSON & SHERIDAN, LLP

(57) ABSTRACT

A method for etching a hardmask layer includes forming a photoresist layer comprising an organometallic material on a hardmask layer comprising a metal-containing material, exposing the photoresist layer to ultraviolet radiation through a mask having a selected pattern, removing un-irradiated areas of the photoresist layer to pattern the photoresist layer, forming a passivation layer comprising a carbon-containing material selectively on a top surface of the patterned photoresist layer, and etching the hardmask layer exposed by the patterned photoresist layer having the passivation layer formed thereon.

20 Claims, 4 Drawing Sheets

(51) Int. Cl.
*G03F 7/004* (2006.01)
*G03F 7/20* (2006.01)

(58) Field of Classification Search
CPC ... H01L 21/312; H01L 21/3146; H01L 21/47; G03F 7/0042; G03F 7/2004
See application file for complete search history.

(56) References Cited

U.S. PATENT DOCUMENTS

| | | | |
|---|---|---|---|
| 2006/0154477 A1* | 7/2006 | Geng | H01L 21/0337 257/E21.252 |
| 2007/0111373 A1* | 5/2007 | Ueda | H01L 21/0332 438/105 |
| 2007/0238295 A1* | 10/2007 | Alapati | H01L 21/0337 257/E21.549 |
| 2009/0191711 A1* | 7/2009 | Rui | G03F 7/40 156/345.24 |
| 2010/0255412 A1 | 10/2010 | Sun | |
| 2019/0334028 A1* | 10/2019 | Zi | H01L 21/823431 |
| 2020/0124970 A1 | 4/2020 | Kocsis et al. | |
| 2020/0273705 A1 | 8/2020 | Singh et al. | |
| 2021/0033974 A1 | 2/2021 | Singh et al. | |

OTHER PUBLICATIONS

International Search Report dated Jul. 12, 2021 for Application No. PCT/US2021/022820.

* cited by examiner

SELECTIVE DEPOSITION OF CARBON ON PHOTORESIST LAYER FOR LITHOGRAPHY APPLICATIONS

CROSS-REFERENCE TO RELATED APPLICATIONS

This application claims priority to U.S. Provisional Patent Application Ser. No. 63/023,290, filed May 12, 2020, which is herein incorporated by reference.

BACKGROUND

Field

The embodiments herein generally relate to a film stack and an etching process for etching such film stack with high selectivity and good profile control to extreme ultraviolet (EUV) lithography exposure and patterning process.

Description of the Related Art

Reliably producing submicron and smaller features is one of the key requirements of very large scale integration (VLSI) and ultra large scale integration (ULSI) of semiconductor devices. However, with the continued miniaturization of circuit technology, the size and pitch of circuit features, such as interconnects, have placed additional demands on processing capabilities. The multilevel interconnects that lie at the heart of this technology require precise imaging and placement of high aspect ratio features, such as vias and other interconnects. Reliable formation of these interconnects is critical to further increases in device and interconnect density. Additionally, forming sub-micron size features and interconnects with reduced waste of intermediate materials, such as resists and hardmask materials, is desired.

As feature sizes have become smaller, the demand for higher aspect ratios, defined as the ratio between the depth of the feature and the width of the feature, has steadily increased to 20:1 and even greater. Developing film stacks and etch processes that are capable of reliably forming features with such high aspect ratios presents a significant challenge. However, inaccurate control or low resolution of the lithography exposure and developing process may cause inaccurate dimension of a photoresist layer utilized to transfer features in a film stack, resulting in unacceptable line width roughness (LWR). Large line width roughness (LWR) and undesired wiggling profile of the photoresist layer resulting from the lithography exposure and developing process may cause inaccurate feature transfer to the film stack, thus, eventually leading to device failure and yield loss.

Furthermore, during etching of a film stack, redeposition or build-up of by-products or other materials generated during the etching process may accumulate on the top and/or sidewalls of the features being etched, thus undesirably blocking the opening of the feature being formed in the material layer. Different materials selected for the film stack may result in different amounts or profiles of the by-products redeposited in the film stack. Furthermore, as the opening of the etched features are narrowed and/or sealed by the accumulated redeposition of material, the reactive etchants are prevented from reaching the lower surface of the features, thus limiting the aspect ratio that may be obtained. Additionally, as the redeposition material or build-up of by-products may randomly and/or irregularly adhere to the top surface and/or sidewalls of the features being etched, the resulting irregular profile and growth of the redeposition material may alter the flow path of the reactive etchants, thus resulting in bowing or twisting profiles of the features formed in the material layer. Inaccurate profile or structural dimensions may result in collapse of the device structure, eventually leading to device failure and low product yield. Poor etching selectivity to the materials included in the film stack may undesirably result in an inaccurate profile control, thus eventually leading to device failure.

Therefore, there is a need in the art for a proper film stack and an etching method for etching features with desired profile and small dimensions in such film stack.

SUMMARY

Methods for forming a film stack and etching the same to form high aspect ratio features in the film stack are provided. The methods described herein facilitate profile and dimension control of features with high aspect ratios through a proper sidewall and bottom management scheme with desired materials selected for the film stack. In one or more embodiments, a method for etching a hardmask layer includes forming a photoresist layer comprising an organometallic material on a hardmask layer comprising a metal-containing material, exposing the photoresist layer to ultraviolet radiation through a mask having a selected pattern, removing un-irradiated areas of the photoresist layer to pattern the photoresist layer, forming a passivation layer comprising a carbon-containing material selectively on a top surface of the patterned photoresist layer, and etching the hardmask layer exposed by the patterned photoresist layer having the passivation layer formed thereon.

In other embodiments, a method for etching a film stack includes forming a bottom anti-reflective coating layer on a film stack, forming a hardmask layer comprising a metal-containing material on the bottom anti-reflective coating layer, forming a photoresist layer comprising an organometallic material on the hardmask layer, exposing the photoresist layer to ultraviolet radiation through a mask having a selected pattern, removing un-irradiated areas of the photoresist layer to pattern the photoresist layer, forming a passivation layer comprising a carbon-containing material selectively on a top surface of the patterned photoresist layer, etching the hardmask layer exposed by the patterned photoresist layer having the passivation layer formed thereon to pattern the hardmask layer, etching the bottom anti-reflective coating layer exposed by the patterned hardmask layer to pattern the bottom anti-reflective coating layer, and etching the film stack exposed by the patterned bottom anti-reflective coating layer.

In some embodiments, a method for selectively forming a passivation layer on a patterned photoresist layer includes exposing a photoresist layer comprising an organometallic material to ultraviolet radiation through a mask, removing un-irradiated areas of the photoresist layer, and forming a passivation layer comprising a carbon-containing material selectively on a top surface of the photoresist layer.

BRIEF DESCRIPTION OF THE DRAWINGS

So that the manner in which the above recited features of the embodiments herein are attained and can be understood in detail, a more particular description of the disclosure, briefly summarized above, may be had by reference to the examples thereof which are illustrated in the appended drawings.

Figure 1:
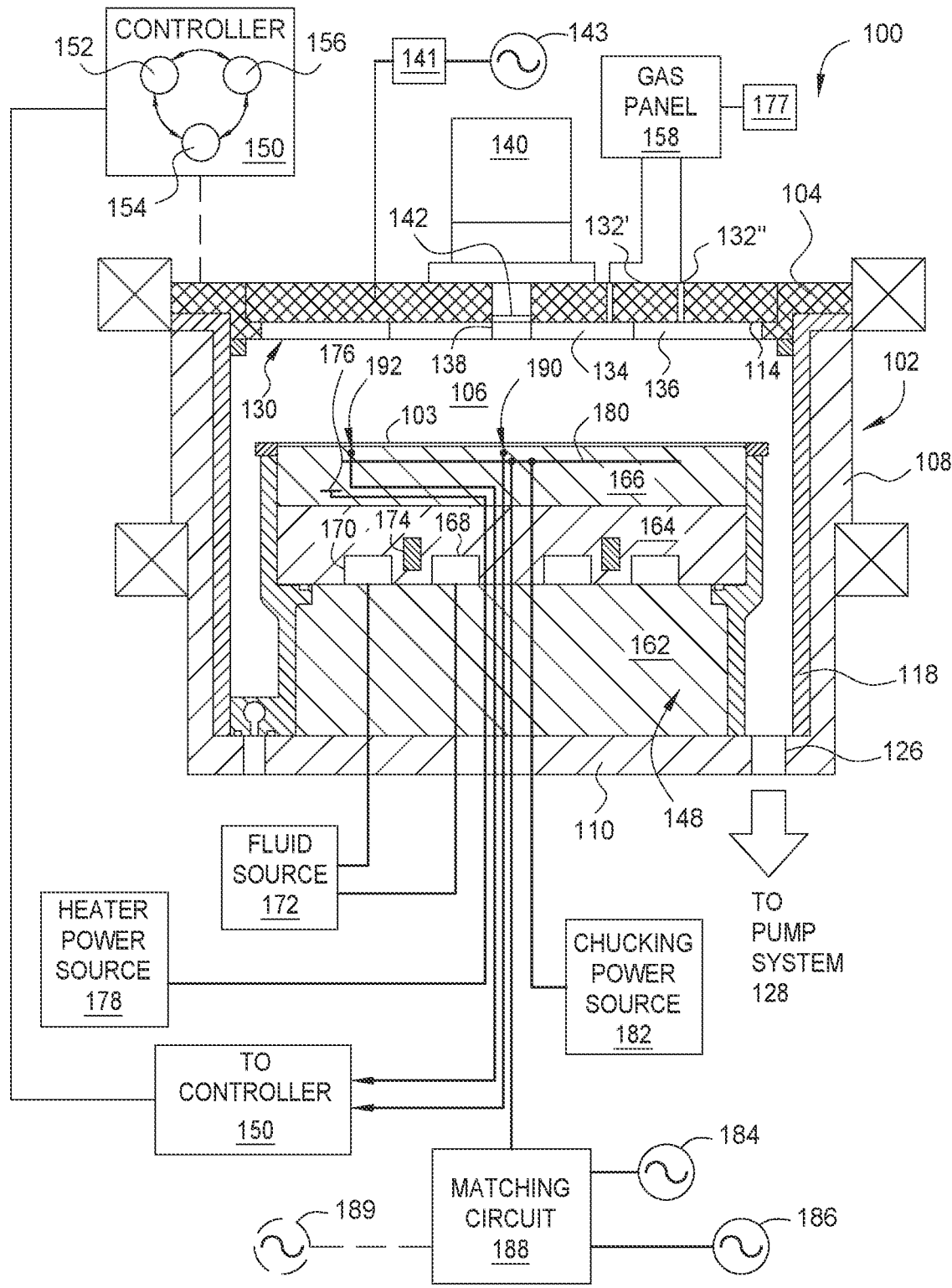
FIG. 1 is a cross-sectional view of a processing chamber according to one embodiment.

To facilitate understanding of the embodiments, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary examples and are therefore not to be considered limiting of its scope, for the invention may admit to other equally effective embodiments.

DETAILED DESCRIPTION

Methods for forming a film stack and etching the same to form high aspect ratio features in the film stack are provided. The methods described herein facilitate profile and dimension control of features with high aspect ratios through a proper sidewall and bottom management scheme with desired materials selected for the film stack. In particular, the methods described herein provide a metal-containing photoresist layer having a carbon-containing passivation layer selectively disposed thereon that has a high etch selectivity from an underlying metal-containing hardmask layer, leading to higher accuracy control of profile of openings etched in the hardmask layer.

FIG. 1 is a cross-sectional view of one example of a processing chamber 100 suitable for performing a patterning process to etch a film stack having a hardmask layer fabricated from a metal-containing material. Suitable processing chambers that may be adapted for use with the teachings disclosed herein include, for example, an ENABLER® or C3® processing chamber available from Applied Materials, Inc. of Santa Clara, Calif. Although the processing chamber 100 is shown including a plurality of features that enable superior etching performance, it is contemplated that other processing chambers may be adapted to benefit from one or more of the inventive features disclosed herein.

The processing chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 103 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one or more implementations, the pump system 128 maintains the pressure inside the interior volume 106 at operating pressures typically between about 10 mTorr to about 500 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one implementation, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or a substrate 103 positioned on a substrate support pedestal assembly 148 through the window 142. In one or more embodiments, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

A gas panel 158 is coupled to the processing chamber 100 to provide process and/or cleaning gases to the interior volume 106. In the example depicted in FIG. 1, inlet ports 132', 132" are provided in the lid 104 to allow gases to be delivered from the gas panel 158 to the interior volume 106 of the processing chamber 100.

A showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

A remote plasma source 177 may be optionally coupled to the gas panel 158 to facilitate dissociating gas mixture from a remote plasma prior to entering into the interior volume 106 for processing. A radio frequency (RF) power source 143 is coupled through a matching network 141 to the showerhead assembly 130. The RF power source 143 typically is capable of producing up to about 3,000 W at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be an aperture or plurality of apertures formed or disposed in the showerhead assembly 130 that is substantially transmissive to the wavelengths of energy generated by, and reflected back to, the optical monitoring system 140. In one or more embodiments, the passage 138 includes the window 142 to prevent gas leakage through the passage 138. The window 142 may be a sapphire plate, quartz plate or other suitable material. The window 142 may alternatively be disposed in the lid 104.

In one implementation, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through separate inlet ports 132', 132".

The substrate support pedestal assembly 148 is disposed in the interior volume 106 of the processing chamber 100 below the showerhead assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 may closely circumscribe the periphery of the substrate support pedestal assembly 148.

In one implementation, the substrate support pedestal assembly 148 includes a mounting plate 162, a base 164 and an electrostatic chuck 166. The mounting plate 162 is coupled to the bottom 110 of the chamber body 102 and includes passages for routing utilities, such as fluids, power lines and sensor leads, among others, to the base 164 and the electrostatic chuck 166. The electrostatic chuck 166 includes at least one clamping electrode 180 for retaining the substrate 103 below showerhead assembly 130. The electrostatic chuck 166 is driven by a chucking power source 182 to develop an electrostatic force that holds the substrate 103 to the chuck surface, as is conventionally known. Alternatively, the substrate 103 may be retained to the substrate support pedestal assembly 148 by clamping, vacuum, or gravity.

At least one of the base 164 or electrostatic chuck 166 may include at least one optional embedded heater 176, at least one optional embedded isolator 174, and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192. The electrostatic chuck 166 may further comprise a plurality of gas passages (not shown), such as grooves, that are formed in a substrate support pedestal supporting surface of the electrostatic chuck 166 and fluidly coupled to a source of a heat transfer (or backside) gas, such as He. In operation, the backside gas is provided at controlled pressure into the gas passages to enhance the heat transfer between the electrostatic chuck 166 and the substrate 103.

In one implementation, the substrate support pedestal assembly 148 is configured as a cathode and includes a clamping electrode 180 that is coupled to a plurality of RF bias power sources 184, 186. The RF bias power sources 184, 186 are coupled between the electrode 180 disposed in the substrate support pedestal assembly 148 and another electrode, such as the showerhead assembly 130 or the lid 104 of the chamber body 102. The RF bias power excites and sustains a plasma discharge formed from the gases disposed in the processing region of the chamber body 102.

In the example depicted in FIG. 1, the dual RF bias power sources 184, 186 are coupled to the electrode 180 disposed in the substrate support pedestal assembly 148 through a matching circuit 188. The signal generated by the RF bias power sources 184, 186 is delivered through matching circuit 188 to the substrate support pedestal assembly 148 through a single feed to ionize the gas mixture provided in the processing chamber 100, thereby providing ion energy necessary for performing a deposition or other plasma enhanced process. The RF bias power sources 184, 186 are generally capable of producing an RF signal having a frequency of about 50 kHz to about 200 MHz and a power of about 0 watts and about 8,000 watts, such as about 1 watt and about 5,000 watts. An additional bias power source 189 may be coupled to the electrode 180 to control the characteristics of the plasma.

During operation, the substrate 103 is disposed on the substrate support pedestal assembly 148 in the processing chamber 100. A process gas and/or gas mixture is introduced into the chamber body 102 through the showerhead assembly 130 from the gas panel 158. The pump system 128 maintains the pressure inside the chamber body 102 while removing deposition by-products.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 may be any form of general purpose computer processor that may be used in an industrial setting. The software routines can be stored in the memory 154, such as random access memory, read only memory, floppy, or hard disk drive, or other form of digital storage. The support circuit 156 is conventionally coupled to the CPU 152 and may include cache, clock circuits, input/output systems, power supplies, and the like. Bi-directional communications between the controller 150 and the various components of the processing chamber 100 are handled through numerous signal cables.

Figure 2:
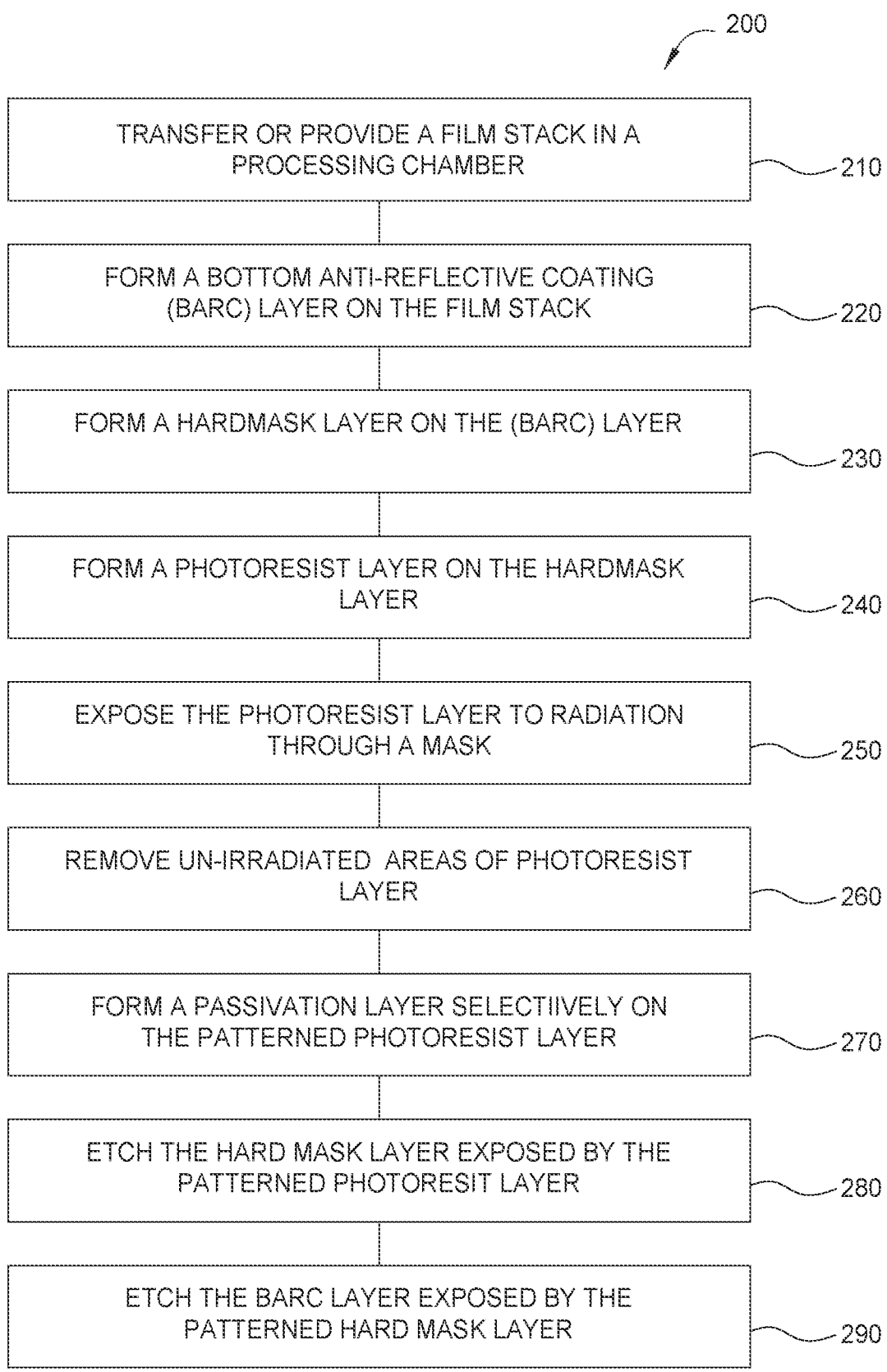
FIG. 2 depicts a flow diagram for a patterning process according to one embodiment.

FIG. 2 is a flow diagram of a method 200 for a patterning process according to one embodiment described herein. FIGS. 3A-3I are cross-sectional views of a structure 300 formed during the patterning process of FIG. 2. The method 200 may be utilized to form features, such as trenches, vias, openings, and the like, with desired critical dimensions and profiles. In some embodiments, dimensions of such features are between about 14 nm and about 22 nm, for example about 18 nm. The structure 300 may be utilized in a gate structure, a contact structure or an interconnection structure in a front end or back end process. Alternatively, the method 200 may be beneficially utilized to etch other types of structures. Those skilled in the art should recognize that a full process for forming a semiconductor device and the associated structures are not illustrated in the drawings or described herein. Although various operations are illustrated in the drawings and described herein, no limitation regarding the order of such operations or the presence or absence of operations is implied. Operations depicted or described as sequential are, unless explicitly specified, merely done so for purposes of explanation without precluding the possibility that the respective operations are actually performed in concurrent or overlapping manner, at least partially if not entirely.

Figure 3A:
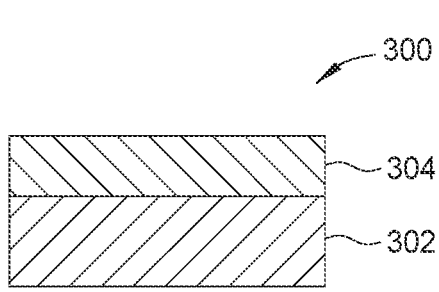
FIGS. 3A, 3B, 3C, 3D, 3E, 3F, 3G, 3H, and 3I are cross-sectional views of a structure formed during the patterning process depicted in FIG. 2 according to one embodiment.

The method 200 starts at operation 210 by transferring or providing a film stack 302, as shown in FIG. 3A, in a processing chamber, such as the processing chamber 100 depicted in FIG. 1. In one embodiment, the film stack 302 may have a number of layers vertically stacked on a substrate. The film stack 302 may include one or more metal-containing dielectric layers and one or more silicon-containing dielectric layers. In some embodiments, the metal-containing dielectric layers may be formed of a high-k material having a dielectric constant greater than 4. Suitable examples of the high-k materials include aluminum oxide ($Al_2O_3$), tantalum oxide ($Ta_2O_5$), tantalum nitride (TaN), tantalum oxynitride ($TaN_xO_y$, $0 \leq x$, $y \leq 1$), titanium oxide ($TiO_2$), titanium nitride (TiN), zirconium dioxide ($ZrO_2$), hafnium dioxide ($HfO_2$), hafnium silicon oxide ($HfSiO_4$), lanthanum oxide (La$_2$O$_3$), yttrium oxide (Y$_2$O$_3$), strontium titanate (SrTiO$_3$), barium strontium titanate (BST, BaSrTiO$_3$), bismuth doped strontium titanate (Bi:SrTiO$_3$), and lead zirconate titanate (PZT, Pb[Zr$_x$Ti$_{1-x}$]O$_3$, 0≤x≤1), among others. The silicon-containing dielectric layers may be formed of silicon oxide (SiO$_2$), silicon nitride (SiN), silicon oxynitride (SiON), silicon carbide (SiC), silicon oxycarbide (SiO$_x$C$_y$, 0≤x, y≤1), or the like.

The substrate may be any one of semiconductor substrates, silicon wafers, glass substrates and the like. The substrate may be formed of a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate may have various dimensions, such as 200 mm, 300 mm, 450 mm, or other diameter, as well as being a rectangular or square panel.

At operation 220, a bottom anti-reflective coating (BARC) layer 304 is formed on the film stack 302, as depicted in FIG. 3A. In some embodiments, the BARC layer 304 is made of carbon-containing material, such as boron doped amorphous carbon. The BARC layer 304 may be a Saphira™ Advanced Patterning Film (APF) carbon hardmask produced by Applied Materials, Inc., located in Santa Clara, Calif. In some embodiments, the BARC layer 304 is a high-density carbon-containing layer and has superior film qualities such as improved hardness and density. Such hardness and density allow the BARC layer 304 to act as a stronger barrier against metal infiltration and to prevent and reduce nanofailures to a greater extent than conventional spin-on carbon (SOC) hard masks.

The BARC layer 304 may be formed by a physical vapor deposition (PVD) process, a plasma enhanced chemical vapor deposition (PECVD) process, or other suitable deposition processes. In one embodiment, the BARC layer 304 is a diamond-like carbon layer formed by chemical vapor deposition CVD (plasma enhanced and/or thermal) processes using hydrocarbon-containing gas mixtures including precursors such as C$_2$H$_2$, C$_3$H$_6$, CH$_4$, C$_4$H$_8$, 1,3-dimethyladamantane, bicyclo[2.2.1]hepta-2,5-diene (2,5-Norbornadiene), adamantine (C$_{10}$H$_{16}$), norbornene (C$_7$H$_{10}$), or combinations thereof. The deposition process may be carried out at temperatures ranging from −50 degrees Celsius to 600 degrees Celsius. The deposition process may be carried out at pressures ranging from 0.1 mTorr to 10 Torr in the interior volume 106 of the processing chamber 100. The hydrocarbon-containing gas mixture may further include a carrier gas such as He, Ar, Xe, N$_2$, H$_2$, or combination thereof, and etchant gases such as Cl$_2$, CF$_4$, NF$_3$, or combination thereof to improve film quality. The plasma (e.g., capacitive-coupled plasma) may be formed from either top and bottom electrodes or side electrodes of the processing chamber 100. The electrodes may be formed from a single powered electrode, dual powered electrodes, or more electrodes with multiple frequencies such as, but not limited to, 350 KHz, 2 MHz, 13.56 MHz, 27 MHz, 40 MHz, 60 MHz, and 100 MHz, being used alternatively or simultaneously in a CVD system.

Figure 3B:
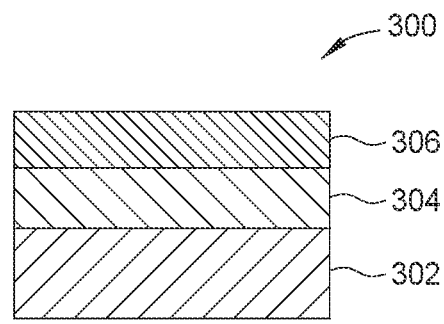

At operation 230, a hardmask layer 306 is formed on the BARC layer 304, as depicted in FIG. 3B. The hardmask layer 306 may be a metal oxide layer. Material selected for the hardmask layer 306 may affect reflection and/or absorption efficiency of extreme ultraviolet (EUV) radiation having a wavelength of between about 5 nm and about 20 nm, for example, about 13.5 nm during lithography exposure process. Thus, by proper selection of material for the hardmask layer 306, performance of EUV lithography exposure process, such as high lithography resolution, defect reduction, photoresist layer profile control, energy dose reduction, and/or line edge roughness reduction, may be enhanced. For example, material having a higher metal concentration may provide a higher absorption coefficient of EUV radiation, and thus the hardmask layer 306 may be formed of metal-containing material, such as a metal dielectric layer, containing one or more metal elements having an atomic number greater than 28, such as 29-32, 37-51, and 55-83. Suitable metal elements include tin (Sn), tantalum (Ta), indium (In), gallium (Ga), zinc (Zn), zirconium (Zr), aluminum (Al), or combinations thereof. Furthermore, low concentration of silicon dopants and/or oxygen elements in the metal-containing material may further increase free carriers, enhancing absorption coefficient of EUV radiation and reducing likelihood of defect generation. Suitable examples of the metal-containing materials for the hardmask layer 306 may be or include tin oxide (SnO), tin silicon oxide (SnSiO), tantalum oxide (TaO), indium tin oxide (InSnO), indium gallium zinc oxide (IGZO), one or more alloys thereof, one or more dopants thereof, or any combination thereof having a ratio of metal elements to silicon or oxygen elements (metal:Si/O) between about 80:1/19 and about 90:1/9. The metal-containing material for the hardmask layer 306 may have a EUV absorption cross section greater than 1×10$^5$ (cm$^2$/mol) under an EUV radiation having a wavelength ranging between about 5 nm and about 20 nm. In one or more examples, the hardmask layer 306 has a thickness between about 10 Å and about 500 Å, such as between about 20 Å and about 200 Å, for example, between about 50 Å and about 100 Å.

In some embodiments, the hardmask layer 306 includes multiple layers. The hardmask layer 306 may have multiple layers that are formed from different metal-containing materials. Selection of the metal-containing materials for the multiple layers is based on different absorption coefficients of the metal-containing materials. For example, multiple layers having high to low, low to high, or alternating high and low absorption coefficients may be sequentially formed so as to enhance reflection of the EUV radiation during the lithography exposure process. In one or more examples, the metal elements selected for one of multiple layers may have atomic numbers greater than 28, such as greater than 35 and another may have atomic numbers less than 28.

In some embodiments, the hardmask layer 306 includes a bilayer structure, having a first portion (e.g., an upper portion or layer) containing a metal element having an atomic number greater than 28, such as 29-32, 37-51, and 55-83, and a second portion (e.g., a lower portion or layer) containing an element having an atomic number of less than 28, such as 3-8, 11-16, and 19-27.

In some embodiments, the hardmask is formed as a gradient having different ratio of the metal elements to the silicon and/or oxygen elements in the hardmask layer 306 to provide different absorption coefficients along the bulk film body of the hardmask layer 306. For example, the metal element concentration of the hardmask layer 306 may be gradually increased or decreased with the thickness increase of the hardmask layer 306. Alternatively, each layer of the bilayer structure or the multiple layers of the hardmask layer 306 may also be a gradient layer. For example, in the bilayer structure of the hardmask layer 306, the upper portion of the hardmask layer 306 may have a low resistivity with relatively high metal element concentration or even pure metal layer (e.g., such as a metallic Sn layer) while the lower portion of the hardmask layer 306 may have a high concentration of silicon and/or oxygen.

The hardmask layer 306 may be formed by a CVD process, a PVD process, an atomic layer deposition (ALD) process, a spin-on-coating process, a spray coating process, or other suitable deposition processes. In some embodiments, during a plasma enhanced CVD or PVD process of forming the hardmask layer 306, a carrier gas and/or an inert gas with relatively higher atomic weight, such as Xe or Kr, may be used. The temperature controlled during the formation of the hardmask layer 306 may be controlled between −50° C. and about 250° C. It is believed that a relatively low temperature control, e.g., less than 250° C., while forming the hardmask layer 306 may assist forming the hardmask layer 306 at a relatively slow deposition rate, rendering a film surface with a relatively smooth surface.

Figure 3C:
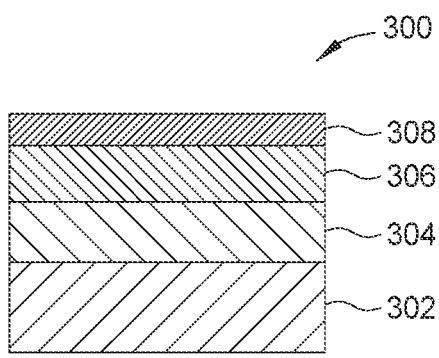

At operation 240, a photoresist layer 308 is formed on the hardmask layer 306, as depicted in FIG. 3C. In the embodiments described herein, the photoresist layer 308 is formed of an organometallic material including organic ligands. The organometallic material layer may be formed of a polymeric metal oxo/hydroxo network in which the metals are bonded with the oxo ligands ($O^{2-}$) and hydroxo ligands ($OH^-$), and also with organic ligands, or a polynuclear metal oxo/hydroxo species with organic ligands.

The photoresist layer 308 may be formed by a CVD process, a PVD process, an ALD process, a spin-on-coating process, a spray coating process, or other suitable deposition processes, using a precursor solution that includes metal oxo-hydroxo cations with organic ligands in an organic solvent. Metal (M) oxo-hydroxo cations herein refer to one or more metal (M) ions that are bonded to oxygen atoms (O) to form oxo ligands ($O^{2-}$) and/or hydroxo ligands ($OH^-$) with release of hydrogen ions ($H^-$) in an aqueous solutions. Metal (M) oxo-hydroxo cations are further bonded to the organic ligands to form one or more metal carbon (M-C) ligand bonds and/or metal carboxylate ($M-O_2C$) ligand bonds. Suitable metals (M) for formation of metal oxo/hydroxo cations include group 13, 14, and 15 metals, such as tin (Sn), antimony (Sb), and indium (In). Additional metals, for example, Ti, Zr, Hf, V, Co, Mo, W, Al, Ga, Si, Ge, P, As, Y, La, Ce, Lu, or combinations thereof, may be blended in the precursor solution to produce more complex polynuclear metal oxo/hydroxo cations (i.e., including two or more metal atoms). The additional metals may be as alternatives to or in addition to tin (Sn), antimony (Sb), and/or indium (In). If blends of metal ions are used, the mole ratio of non-tin/antimony/indium ion per tin/antimony/indium metal ion is up to about 1 in one example, and between about 0.1 and about 0.75 in other examples. In some embodiments, tin (Sn) or indium (In) is used in the precursor solution to form a photoresist layer having strong absorption of extreme ultraviolet radiation (EUV) at 13.5 nm wavelength, and in combination with organic ligands, good absorption of ultraviolet (UV) radiation at 193 nm wavelength. In some embodiments, Hf is used to provide good absorption of electron beam material and extreme UV (EUV) radiation. In some embodiments, one or more metal compositions including Ti, V, Mo, W, or combinations thereof are added to move an absorption edge to longer wavelengths to provide sensitivity to ultraviolet (UV) radiation at 248 nm wavelength.

The organic ligands may be, for example, alkyls (e.g., methyl, ethyl, propyl, butyl, t-butyl, aryl (phenyl, benzyl)), alkenyls (e.g., vinyl, allyl), and carboxylates (e.g., acetate, propanoate, butanoate benzoate). A ratio of concentration of the organic ligands to concentration of the metal oxo-hydroxo cations in the precursor solution is between about 0.25 and about 4 in one example, and between about 0.5 and about 3.5 in another example, between about 0.75 and about 3 in another example, and between about 1 and about 2.75 in other examples. A person of ordinary skill in the art will recognize that additional ranges of organic ligand concentrations within the explicit ranges above are contemplated and are within the present disclosure.

The organic solvent may be alcohols, esters, or combinations thereof. In some embodiments, the organic solvent includes aromatic compounds (e.g., xylenes, toluene), esters (propylene glycol monomethyl ether acetate, ethyl acetate, ethyl lactate), alcohols (e.g., 4-methyl-2-pentanol, 1-butanol, anisole), ketones (e.g., methyl ethyl ketone), and the like.

In some embodiments, the deposited photoresist layer 308 has a thickness of between about 1 nm and about 1 μm, for example, between about 8 nm and about 13 nm.

Figure 3D:
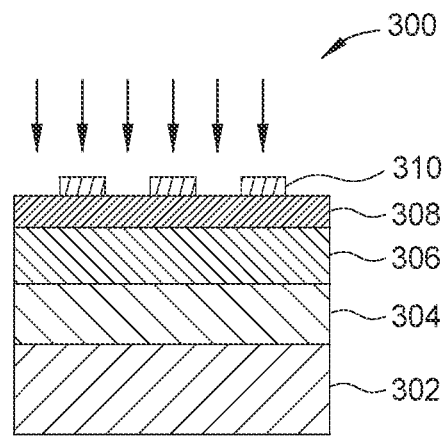

At operation 250, the photoresist layer 308 is exposed to radiation according to a selected pattern including features, such as trenches, vias, openings, and the like, with desired critical dimensions and profiles to be formed in the film stack 302, as depicted in FIG. 3D. The selected pattern is transferred to a corresponding pattern or latent image in the photoresist layer 308 with irradiated areas and un-irradiated areas. When exposed to radiation, the photoresist layer 308 absorbs radiation that results in energy that breaks the bonds between the metal and the organic ligands (i.e., metal carbon (M-C) ligand bonds and/or metal carboxylate ($M-O_2C$) ligand bonds) within the irradiated areas of the photoresist layer 308. This breakage of the bonds may lead to a composition change in the irradiated areas of the photoresist layer 308 through formation of metal hydroxide (M-OH) ligand bonds or through condensation to form metal-oxygen (M-O-M) ligands bonds.

With the absorption of a sufficient amount of radiation, there is a contrast of material properties between the irradiated areas of the photoresist layer 308 without or substantially without the organic ligands and the un-irradiated areas of the photoresist layer 308 with the organic ligands intact. For example, the un-irradiated areas of the photoresist layer 308 having the organic ligands are relatively hydrophobic, and the irradiated areas of the photoresist layer 308 not having the organic ligands are less hydrophobic (i.e., more hydrophilic) than the un-irradiated areas of the photoresist layer 308. Using this contrast, the photoresist layer 308 may provide positive tone patterning (in which the irradiated areas become soluble to a developer agent) and negative tone patterning (in which the irradiated areas become insoluble to a developer agent) with suitable developer agents.

The radiation may be electromagnetic radiation, an electron beam, or other suitable radiation. Radiation may be directed to the photoresist layer 308 through a mask 310 or a radiation beam may be controllably scanned across the photoresist layer 308. Electromagnetic radiation may have a desired wavelength or range of wavelengths, such as visible radiation, ultraviolet (UV) radiation (between 100 nm and 400 nm, including extreme ultraviolet (EUV) between 10 nm and 121 nm and far ultraviolet (FUV) between 122 nm and 200 nm), or x-ray radiation (soft x-rays between 0.1 nm and 10 nm), depending on desired spatial resolution of patterning the underlying film stack 302. A higher resolution pattern may be achieved with shorter wavelength radiation, such as ultraviolet radiation, x-ray radiation, or an electron beam. For example, EUV radiation generated from a Xe or Sn plasma source excited using high energy lasers or discharge pulses may be used for lithography at 13.5 nm.

In some embodiments, the contrast may be enhanced by a post-irradiation heat treatment.

Figure 3E:
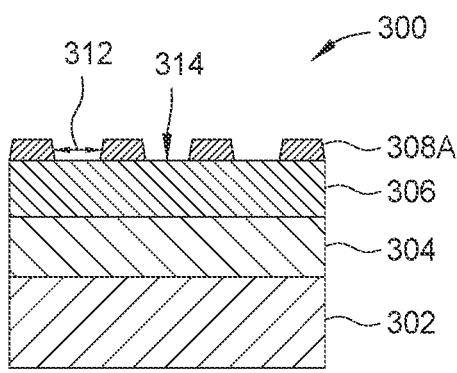

At operation 260, the photoresist layer 308 is developed to pattern the photoresist layer 308 according to the selected pattern, as depicted in FIG. 3E. The patterned photoresist layer 308A defines openings 312 that expose a surface 314 of the underlying hardmask layer 306 for etching.

A developer agent for developing the irradiated photoresist layer 308 and removing the un-irradiated areas of the photoresist layer 308 (i.e., negative tone patterning) to form a patterned photoresist layer 308A may include an organic solvent, such as the solvents used in the precursor solutions. In some embodiments, suitable developer agents include aromatic compounds (e.g., benzene, xylenes, toluene), esters (e.g., propylene glycol monomethyl ester acetate, ethyl acetate, ethyl lactate, n-butyl acetate, butyrolactone), alcohols (e.g., 4-methyl-2-pentanol, 1-butanol, isopropanol, anisole), ketones (e.g., methyl ethyl ketone, acetone, cyclohexanone), ethers (e.g., tetrahydrofuran, dioxane) and the like. The development is performed for about 5 seconds to about 30 minutes in one example, from about 8 seconds to about 15 minutes in another example, and from about 10 seconds to about 10 minutes.

In some embodiments, the developer agent may include additional compositions to facilitate the development process, for example, improving the contrast, sensitivity and line width roughness, and inhibiting formation and precipitation of metal oxide particles. Suitable additives include, for example, dissolved salts with cations selected from the group consisting of ammonium, d-block metal cations (hafnium, zirconium, lanthanum, or the like), f-block metal cations (cerium, lutetium or the like), p-block metal cations (aluminum, tin, or the like), alkali metals (lithium, sodium, potassium or the like), and combinations thereof, and with anions selected from the group consisting of fluoride, chloride, bromide, iodide, nitrate, sulfate, phosphate, silicate, borate, peroxide, butoxide, formate, ethylenediamine-tetraacetic acid (EDTA), tungstate, molybdate, or the like and combinations thereof. Other potentially useful additives include, for example, molecular chelating agents, such as polyamines, alcohol amines, amino acids, or combinations thereof. If the optional additives are present, the developer agent may include no more than about 10 weight percent additive in one example, and no more than about 5 weight percent additive in another example. A person of ordinary skill in the art will recognize that additional ranges of additive concentrations within the explicit ranges above are contemplated and are within the present disclosure.

The developer agent may be applied to the irradiated photoresist layer 308 using a spin-on-coating process, a spray coating process, or other suitable coating processes. In some embodiments, spin rinsing and/or drying may be performed to complete the development process. Suitable rinsing solutions include ultrapure water, methyl alcohol, ethyl alcohol, propyl alcohol, and combinations thereof.

In some embodiments, the patterned photoresist layer 308A may be treated to further condense the material and to further dehydrate the material. In some embodiments, the patterned photoresist layer 308A may be heated to a temperature of between about 100° C. and about 600° C. in one example, between about 175° C. and about 500° C. in another example, and between about 200° C. and about 400° C. in other examples. The heating may be performed for at least about 1 minute in one example, for about 2 minutes to about 1 hour in another example, and for between about 2.5 minutes and about 25 minutes in other examples. The heating may be performed in air, vacuum, or an inert gas ambient, such as Ar or $N_2$. A person of ordinary skill in the art will recognize that additional ranges of temperatures and time for the heat treatment within the explicit ranges above are contemplated and are within the present disclosure.

In some embodiments, adjacent linear segments of neighboring structures can have an average pitch of no more than about 60 nm, in some embodiments no more than about 50 nm and in further embodiments no more than about 40 nm.

Figure 3F:
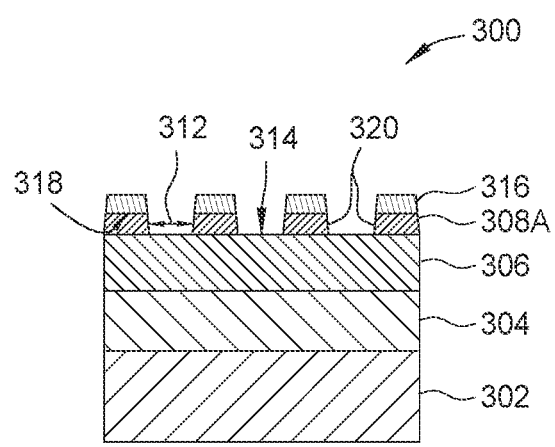

At operation 270, a passivation layer 316 is formed selectively on the patterned photoresist layer 308A prior to etching of the hardmask layer 306, as depicted in FIG. 3F. The passivation layer 316 may be formed of carbon-containing material by supplying a deposition gas mixture on the patterned photoresist layer in a PVD chamber, or in-situ in an etching chamber. In the embodiments described herein, the passivation layer 316 is predominantly formed on a top surface 318 of the patterned photoresist layer 308A, rather than sidewalls 320 of the patterned photoresist layer 308A or the exposed surface 314 of the hardmask layer 306. Thus, profile (e.g., dimensions and geometries) of the openings 312 defined by the patterned photoresist layer 308A are maintained unchanged so as to facilitate transfer of the openings 312 to the hardmask layer 306 without profile alternation.

While not intending to be bound by theory, it is believed that carbon atoms are bonded to the top surface 318 (i.e., the irradiated areas) of the photoresist layer 308 having the metal hydroxide (M-OH) ligand bonds and metal-oxygen (M-O-M) ligand bonds due to the breakage of the bonds between the metal and the organic ligands (i.e., metal carbon (M-C) ligand bonds and/or metal carboxylate ($M-O_2C$) ligand bonds). Sidewalls 320 of the patterned photoresist layer 308A maintain the composition of the un-irradiated photoresist layer 308 having the organic ligands intact, and thus do not contain the metal hydroxide (M-OH) ligand bonds and metal-oxygen (M-O-M) ligand bonds to which carbon atoms can be bonded. The exposed surface 314 of the hardmask layer 306 also does not contain the metal hydroxide (M-OH) ligand bonds and metal-oxygen (M-O-M) ligand bonds, and thus carbon atoms are not bonded to the exposed surface 314 of the hardmask layer 306.

In one or more embodiments, the deposition gas mixture includes a carbon-containing gas, such as CO gas or $CH_4$ gas. As described above, the hardmask layer 306 is formed of a material-containing metal elements, such as tin (Sn), and the photoresist layer 308 is also formed of a material containing metal elements, such as tin (Sn), leading to poor etch selectivity between the hardmask layer 306 and the photoresist layer 308. Thus, if the hardmask layer 306 having the photoresist layer 308 disposed thereon is etched, control of profile of openings etched in the hardmask layer 306 may be inaccurate, eventually leading to device failure. Having the passivation layer 316 disposed thereon, the patterned photoresist layer 308B may have higher etching selectivity from the hardmask layer 306, leading to higher accuracy control of profile of openings etched in the hardmask layer 306.

Figure 3G:
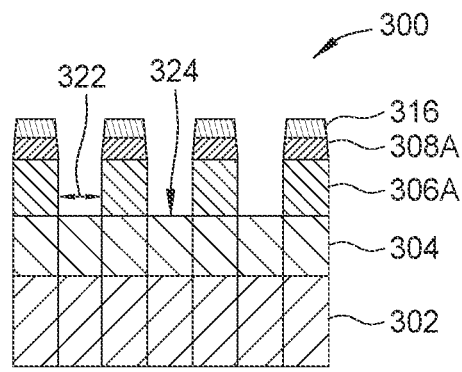

At operation 280, the hardmask layer 306 is etched to transfer the openings 312 of the patterned photoresist layer 308A to the hardmask layer 306, as depicted in FIG. 3G. The patterned hard mask layer 306A defines openings 322 that exposes a surface 324 of the underlying BARC layer 304 for etching. In one or more examples, the etching process at operation 280 is performed by supplying an etching gas mixture into the processing chamber 100 while maintaining a temperature of the substrate support pedestal assembly 148 between room temperature (e.g., about 23° C.) and up to about 150° C.

In some examples, the etching gas mixture includes at least one halogen-containing gas. The halogen-containing gas may include a fluorine-containing gas, a chlorine-containing gas, or a bromide-containing gas. Suitable examples of the halogen-containing gas include $SF_6$, $SiCl_4$, $Si_2Cl_6$, $NF_3$, HBr, $Br_2$, $CHF_3$, $CH_2F_2$, $CF_4$, $C_2F$, $C_4F_6$, $C_3F_8$, HCl, $C_4F_8$, $Cl_2$, HF, $CCl_4$, $CHCl_3$, $CH_2Cl_2$, and $CH_3Cl$. In some examples, silicon-containing gas may also be supplied in the etching gas mixture. Suitable examples of the silicon-containing gas include $SiCl_4$, $Si_2Cl_6$, $SiH_4$, $Si_2H_6$, and the like. Furthermore, particularly, examples of the chlorine-containing gas include HCl, $Cl_2$, $CCl_4$, $CHCl_3$, $CH_2Cl_2$, $CH_3Cl$, $SiCl_4$, $Si_2Cl_6$, and the like, and examples of the bromide-containing gas include HBr, $Br_2$, and the like. A reacting gas, such as an oxygen-containing gas or a nitrogen-containing gas, for example, $O_2$, $N_2$, $N_2O$, $NO_2$, $O_3$, $H_2O$, or the like may also be supplied in the etching gas mixture as needed.

In one or more examples, the halogen-containing gas used to etch the hardmask layer 306 comprises a chlorine-containing gas or a bromide-containing gas. While supplying the etching gas mixture into the processing chamber, an inert gas may be optionally supplied into the etching gas mixture to assist the profile control as needed. Examples of the inert gas supplied in the gas mixture include Ar, He, Ne, Kr, Xe, or the like. In one particular example, the etching gas mixture utilized to etch the hardmask layer 306, such as a metal-containing material (e.g., a Sn/SnO/SnSiO layer), includes HBr, $Cl_2$, Ar, He, or combinations thereof.

During etching, the chamber pressure of the etching gas mixture is also regulated. In one or more embodiments, a process pressure in the plasma processing chamber is regulated between about 2 mTorr to about 100 mTorr, for example, at about 3 mTorr and 20 Torr, such as about 6 mTorr. RF source or bias power may be applied to maintain a plasma formed from a continuous mode or a pulsed mode as needed in presence of the etching gas mixture. For example, an RF power source with a frequency of about 13.56 MHz may be applied at an energy level of between about 200 watts to about 1,000 watts, such as about 500 watts, to an inductively coupled antenna source to maintain a plasma inside the etch chamber. In addition, an RF bias power, with a frequency of between about 2 MHz and about 13.56 MHz, may be applied less than 500 watts, such as between about 0 watts to about 450 watts, such as about 150 watts.

In one or more examples, the RF bias power and the RF power source may be pulsed in the processing chamber 100 during the etching at operation 280. The RF bias power and the RF power source may be synchronized or non-synchronized pulsed into the processing chamber. In some examples, the RF bias power and the RF power source are non-synchronized pulsed into the processing chamber. For example, the RF power source may be pulsed to the processing chamber prior to pulsing the RF bias power. For example, the RF bias power may be in pulse mode synchronized with the RF power source or with a time delay with respect to the RF power source. In one or more examples, the RF power source and the RF bias power are pulsed between about 5% and about 75% of each duty cycle. Each duty cycle, for example between each time unit is between about 0.1 millisecond (ms) and about 10 ms.

In one example of the etching gas mixture supplied at operation 280, the $O_2$ gas may be supplied into the chamber at a rate between about 0 sccm to about 50 sccm. The halogen-containing gas, such as HBr, may be supplied at a flow rate between about 25 sccm and about 250 sccm, such as about 100 sccm.

Figure 3H:
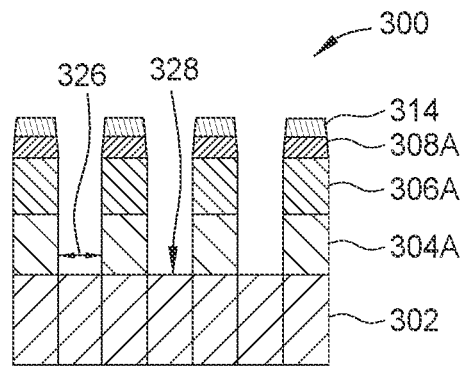

At operation 290, the BARC layer 304 is etched to transfer the openings 322 in the patterned hardmask 360A to the BARC layer 304, as depicted in FIG. 3H. The patterned BARC layer 304A defines openings 326 that exposes a surface 328 of the underlying film stack 302. The etching gas mixture utilized to etch the BARC layer 304 at operation 290 may be the same as the etching gas mixture utilized to etch the hardmask layer 306 at operation 280. Alternatively, the etching gas mixture utilized to etch the BARC layer 304 at operation 290 may be different from the etching gas mixture utilized to etch the hardmask layer 306 at operation 280. In one or more examples, the etching gas mixture utilized to etch the BARC layer 304 at operation 290 may include a chlorine-containing gas, such as HCl or $Cl_2$ gas.

Figure 3I:
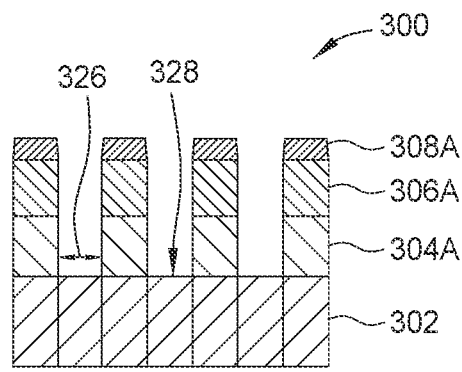

After the openings 326 are formed in the BARC layer 304, a de-scum or a strip process may be performed to remove the remaining passivation layer 316, if any, as shown in FIG. 3I. It is noted that further etching process or patterning process may be performed to continue transferring the openings 326 into the film stack 302 and form the selected pattern including features, such as trenches, vias, openings, and the like, with desired critical dimensions and profiles within the film stack 302.

In the embodiments described herein, the methods are provided for forming a metal-containing photoresist layer having a carbon-containing passivation layer selectively disposed thereon that has a high etch selectivity from an underlying metal-containing hardmask layer, leading to higher accuracy control of profile of openings etched in the hardmask layer. Thus, lithographic exposure accuracy, such as high resolution, low energy dose, good photoresist profile control and low line edge roughness may be enhanced.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for etching a hardmask layer, comprising:
   forming a photoresist layer comprising an organometallic material on a hardmask layer comprising a metal-containing material;
   exposing the photoresist layer to ultraviolet radiation through a mask having a selected pattern, creating irradiated areas and un-irradiated areas of the photoresist layer;
   removing the irradiated or the un-irradiated areas of the photoresist layer to pattern the photoresist layer;
   forming a passivation layer comprising a carbon-containing material only on a top surface of the patterned photoresist layer; and
   etching the hardmask layer exposed by the removed irradiated or un-irradiated areas of the patterned photoresist layer having the passivation layer formed thereon.

2. The method of claim 1, wherein the organometallic material comprises one or more metal elements and organic ligands.

3. The method of claim 2, wherein the one or more metal elements comprise tin (Sn).

4. The method of claim 2, wherein the organic ligands are selected from the group consisting of alkyls, alkenyls, and carboxylates.

5. The method of claim 1, wherein the forming of the passivation layer comprises:
   supplying deposition gas comprising a gas selected from the group consisting of CO and $CH_4$ onto the patterned photoresist layer.

6. A method for etching a film stack, comprising:
   forming a bottom anti-reflective coating layer on a film stack;
   forming a hardmask layer comprising a metal-containing material on the bottom anti-reflective coating layer;
   forming a photoresist layer comprising an organometallic material on the hardmask layer;
   exposing the photoresist layer to ultraviolet radiation through a mask having a selected pattern, creating irradiated areas and un-irradiated areas of the photoresist layer;
   removing the irradiated or the un-irradiated areas of the photoresist layer to pattern the photoresist layer;
   forming a passivation layer comprising a carbon-containing material only on a top surface of the patterned photoresist layer;
   etching the hardmask layer exposed by the removed irradiated or un-irradiated areas of the patterned photoresist layer having the passivation layer formed thereon to pattern the hardmask layer;
   etching the bottom anti-reflective coating layer exposed by the patterned hardmask layer to pattern the bottom anti-reflective coating layer; and
   etching the film stack exposed by the patterned bottom anti-reflective coating layer.

7. The method of claim 6, wherein the organometallic material comprises one or more metal elements and organic ligands.

8. The method of claim 7, wherein the one or more metal elements comprise tin (Sn).

9. The method of claim 7, wherein the organic ligands are selected from the group consisting of alkyls, alkenyls, and carboxylates.

10. The method of claim 6, wherein the forming of the passivation layer comprises:
    supplying deposition gas comprising a gas selected from the group consisting of CO and $CH_4$ onto the patterned photoresist layer.

11. The method of claim 6, wherein the metal-containing material of the hardmask layer comprises tin (Sn).

12. The method of claim 11, wherein the metal-containing material of the hardmask layer is selected from the group consisting of tin oxide (SnO), tin silicon oxide (SnSiO), indium tin oxide (InSnO), and any combination thereof.

13. The method of claim 6, wherein the bottom anti-reflective coating layer comprises a carbon-containing material.

14. A method for selectively forming a passivation layer on a patterned photoresist layer, comprising:
    exposing a photoresist layer comprising an organometallic material to ultraviolet radiation through a mask, creating irradiated areas and un-irradiated areas of the photoresist layer;
    removing the irradiated or the un-irradiated areas of the photoresist layer; and
    forming a passivation layer comprising a carbon-containing material only on a top surface of the photoresist layer.

15. The method of claim 14, wherein the organometallic material comprises one or more metal elements and organic ligands.

16. The method of claim 15, wherein the one or more metal elements comprise tin (Sn).

17. The method of claim 15, wherein the one or more metal elements are selected from the group consisting of tin (Sn), antimony (Sb), and indium (In), and any combination thereof.

18. The method of claim 15, wherein the organic ligands are selected from the group consisting of alkyls, alkenyls, and carboxylates.

19. The method of claim 14, further comprising:
    heating the patterned photoresist layer.

20. The method of claim 14, wherein the forming of the passivation layer comprises:
    supplying deposition gas comprising a gas selected from the group consisting of CO and $CH_4$ onto the patterned photoresist layer.

* * * * *